United States Patent [19]
Salley

[11] 4,046,995
[45] Sept. 6, 1977

[54] MEMORY FULLNESS INDICATOR

[75] Inventor: Ernest J. Salley, Phoenix, Ariz.

[73] Assignee: Engineered Systems, Inc., Phoenix, Ariz.

[21] Appl. No.: 632,263

[22] Filed: Nov. 17, 1975

[51] Int. Cl.² .................. G06K 15/18; G11C 11/00
[52] U.S. Cl. ...................... 235/61.6 R; 340/173 R
[58] Field of Search .......... 235/61.6 R; 340/347 DA, 340/172.5, 173 R

[56] References Cited

U.S. PATENT DOCUMENTS

| | | | |
|---|---|---|---|
| 3,189,892 | 6/1965 | Scott | 340/347 DA |
| 3,798,635 | 3/1974 | Candiani | 340/347 DD |

*Primary Examiner*—Daryl W. Cook
*Attorney, Agent, or Firm*—Drummond, Nelson & Ptak

[57] ABSTRACT

A digital card reader is connected to supply input data to a random access memory corresponding to pre-coded information on cards inserted into the reader. The insertion of a card into the reader causes a binary counter to advance one binary count to address the next location in the memory for storing the data on the card. The outputs of the binary counter, which have encoded thereon the binary addresses, are further coupled to a digital-to-analog converter having an output lead on which an analog representation of the selected address appears. This output lead of the digital-to-analog converter is used to operate an analog meter, such as an ammeter, having a scale calibrated to indicate the degree of fullness of the memory as determined by the binary encoded address information.

12 Claims, 1 Drawing Figure

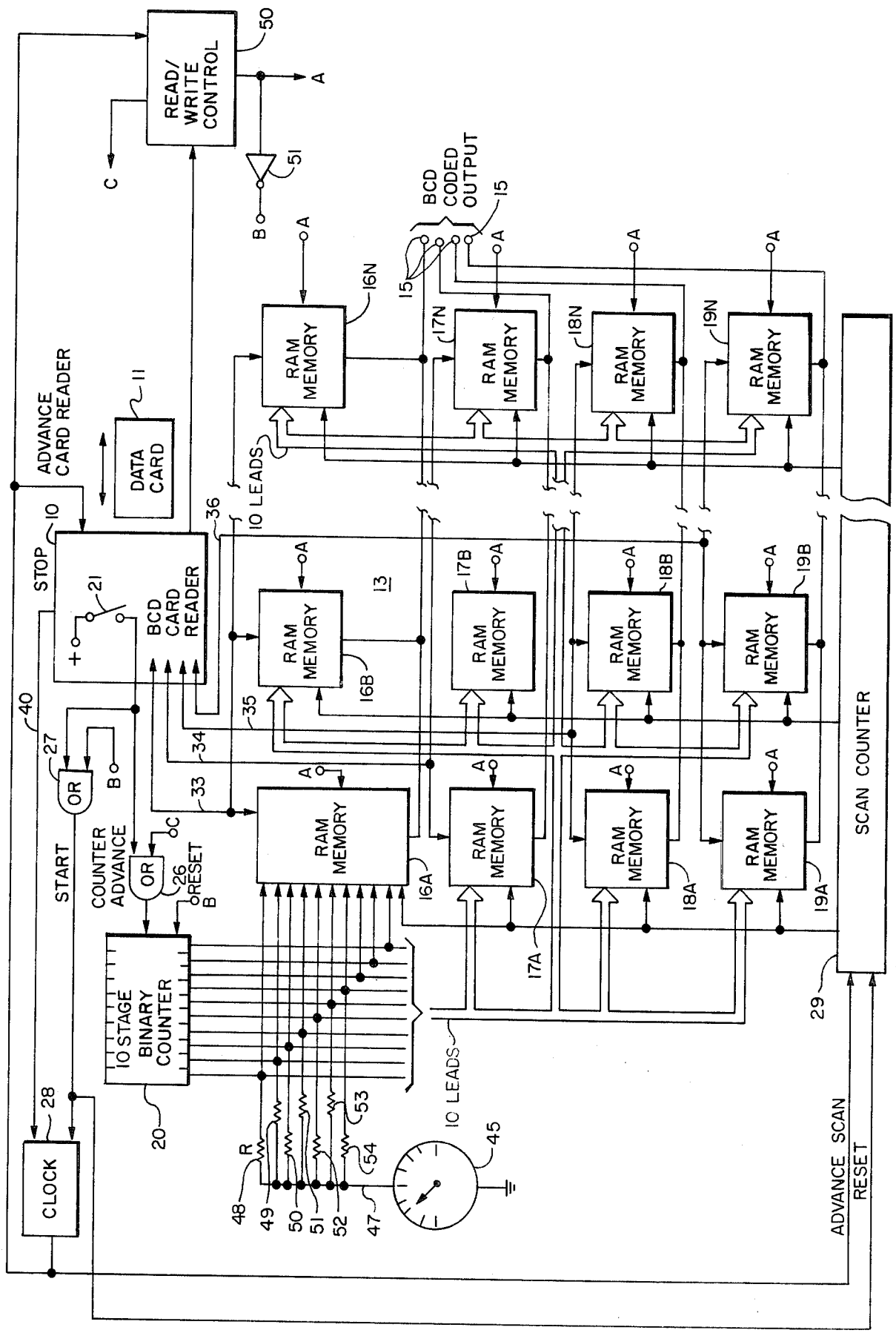

… (1)

MEMORY FULLNESS INDICATOR

BACKGROUND OF THE INVENTION

Random access digital memories are employed in a variety of systems for storing input data information and permitting the reading out of that information at random times. The address location of the data read into the memory and read from the memory generally is determined by digitally or binary encoded address lines which commonly are in the form of the outputs of a standard binary counter.

Every random access memory has some finite capacity, and, in some applications, it is possible to exceed that capacity and lose data which it is desired to have stored, or the memory address counter may be recycled to cause the storage of new data in address locations before the previously stored data at those locations has been read out of the memory or utilized. In such systems, it is common to employ a digital display, or the like, to tell the operator of the system when the memory is full or near full. Utilization of such a display, however, requires the operator to know the capacity of the memory. Then, he must relate this capacity of the memory to the display in order to determine how much more information can be supplied to the memory or to determine the address location being used relative to the maximum capacity of the memory. This is inconvenient at best and is a significant disadvantage when the user of the system is not technically sophisticated or is not familiar with the maximum memory capacity of the system.

Other systems employ an alarm in the form of a buzzer or a light which is energized as the memory is filled or is about to reach its maximum capacity. In systems of this type, however, it often is too late for the operator to make suitable adjustments for redirecting inputs to some other memory or for terminating the supply of data to the memory on the relatively short notice which necessarily exists when such an on/off type of alarm is employed. Until the memory reaches its capacity or near capacity, the user of a system employing an on/off type of alarm has no idea where the information he is supplying into the memory or reading from the memory is addressed or located relative to the total capacity of the memory. As a consequence, it is difficult for the operator to use such a system with assurance that he is utilizing it most efficiency. Generally, the tendency is to build the system with memory overcapacity to avoid reaching the alarm or memory full condition. This is expensive and inefficient.

Accordingly, it is desirable to provide a system for random access memories or read only memories which provides a continuous indication of the degree of "fullness" of the memory, or an indication of the position of a given address location relative to the full memory capacity. It further is desirable to provide such an indication of memory fullness which is readily understandable by users who are not technically sophisticated.

SUMMARY OF THE INVENTION

Accordingly, it is an object of this invention to provide an improved indicator for the selected address of an electronic memory.

It is another object of this invention to provide an indicator showing the relative fullness of a sequentially addressed random access memory.

It is an additional object of this invention to provide an analog indication of the selected address of an electronic memory.

It is a further object of this invention to digitally select the address of a random access memory and employ a digital-to-analog converter to obtain an analog signal useful in indicating the address location selected to the user of a system employing the memory.

In accordance with a preferred embodiment of this invention, these and other objects are accomplished in a system which indicated the relative location of the address of an electronic memory having a predetermined number of address locations. Apparatus is used to address or select specific ones of the address locations in the memory, and an analog display device is coupled with the address selection apparatus for providing an indication of the relative location in the memory of the selected address.

BRIEF DESCRIPTION OF THE DRAWING

The sole FIGURE of the drawing is a block diagram of a preferred embodiment of the invention used in conjunction with a random access memory.

DETAILED DESCRIPTION

Referring now to the drawing, there is shown a preferred embodiment of the invention used in conjunction with a binary coded decimal (BCD) card reader 10. The reader 10 is used to transfer data from data cards 11, which may be inserted therein in random intervals, to a multistage random access memory (RAM) bank 13 for storage in the memory and for ultimate transfer or readout from the memory on four BCD coded output terminals 15. As illustrated, the card reader 10 has four parallel output leads 33, 34, 35 and 36 to supply the BCD encoded information to four corresponding horizontal rows of RAM memories 16, 17, 18 and 19. The number of RAM memories in each row is selected to equal the number of columns of BCD encoded data to be supplied from the data card 11 and the card reader 10. Typically, the information supplied to the RAM memories 16, 17, 18 and 19 may be data uniquely encoded to identify the card holder, such as an employee number, job classification, or the like, along with information supplied by the reader 10 itself, such as location and time. Each different BCD digit is encoded in parallel in the vertical columns of RAM memory units A through N.

In order to determine into which address location of each of the RAM memories 16, 17, 18 and 19 the BCD data from the card reader 10 is to be entered, a ten-stage binary counter 20 is connected to corresponding ten address leads of the memories 16 to 19. The RAM memories 16, 17, 18 and 19 may be of any suitable standard configuration, with the address locations for writing new information into the memory and for reading information from the memory determined by the digitally encoded outputs of the 10-stage binary counter 20. As illustrated, the memories are selected to have a 1024-bit capacity. The actual capacity which is employed is not limited to this particular amount, and can be less or greater, depending upon the desired system parameters.

Whenever a data card 11 is inserted into the card reader 10, a card reader advance switch 21 in the card reader 10 is closed to apply a positive pulse through an OR gate 26 to the counter 20 to advance the count in the counter by one increment. This, then, selects the next available address location in all of the memories 16A through 16N, 17A through 17N, 18A through 18N, and 19A through 19N, which have their address inputs connected in parallel to the outputs of the counter 20.

At the same time, the positive pulse produced by the closure of the switch 21 is applied through a second OR gate 27 to commence the operation of a gated clock oscillator 28 to commence the operation thereof. This same pulse also is applied to a scan counter 29, and resets the counter 29 to its zero or initial condition of operation. In this condition of operation, the first stage of the counter 29 applies an enabling signal to the vertical column A of memories 16, 17, 18 and 19 over an output lead 31. The other output leads from the remaining stages of the counter 29 do not have an output signal on them, so that the remaining columns B through N of the memories 16, 17, 18 and 19 are not enabled. This causes the first column or character of BCD encoded data supplied by the card reader 10 over the four BCD output leads 33, 34, 35 and 36 to be stored in the RAM memories of vertical column A in horizontal rows 16, 17, 18 and 19, respectively.

The next pulse from the gated oscillator clock 28 then is applied to the card reader 10 to advance it to read the next BCD encoded character. This same clock pulse also advances the scan counter 29 to its next count or position, enabling column B of the RAM memory to store the data being stored by the card reader. Successive clock pulses from the gated clock oscillator 28 advance the counter 29 and the card reader 10 to successive characters which are stored in the successive columns of the memory 13 until the final BCD coded character is stored in vertical column N of the RAM memories 16, 17, 18 and 19.

A provision is made in the card reader 10 to count the number of pulses from the gated clock oscillator 28 necessary to transfer all of the necessary data corresponding to the inserted data card 11 to the RAM memories in all of the columns A through N. When this count is reached, an output is applied over a lead 40 to stop the further operation of the gated clock oscillator 28. When the data card 11 is removed, the switch 21 opens and the system is ready for receipt of the next data card 11. The cycle then is repeated, with the 10-stage binary counter 20 first advancing to the next address count to cause storage of the new BCD encoded data into the new address location.

To permit the operator of the system to be continually apprised of the state of fullness of the memories 16, 17, 18 and 19, an analog meter in the form of a standard ammeter 45 is used. The scale of the meter 45 is marked or calibrated in a manner similar to the conventional gasoline gauge commonly used in automobiles, that is, zero or empty, one-fourth, one-half, three-fourths, and full. These indicia have been found to be most convenient in relating the state of memory fullness to operators of non-technical backgrounds. The actual numbers of the address locations in the memory need not be known by the user, who can tell at a glance the relative state of fullness at all times. If it is necessary to have a more accurate indication, actual numerical indicia can be employed in place of or in conjunction with these relatively unsophisticated indicia. The determination of the current used to deflect the meter corresponding to the address location is obtained by connecting at least some of the address output leads from the counter 20 in parallel through binary weighted resistors to a common analog input lead 47 which supplies current through the meter 45 to ground.

Whenever a stage of the binary counter 20 has a binary "1" stored therein, it supplies an output voltage V. A binary "0" is indicated on the corresponding output lead by zero volts or an open circuit condition. The highest order or tenth stage output of the counter 20 is connected through the lowest value resistor 48. This resistor has a resistance R. The actual value of resistance is determined by the voltage V and the amount of current I which needs to flow through the meter 45 to divert the indicating needle to the "full" scale position on the meter. If only the tenth or final stage of the binary counter 20 is energized, the binary address indication is address location 512, which in the example given comprises the one-half full address of the RAM memories 16, 17, 18 and 19. Thus, the value $R$ of the resistor 48 is:

$$R = \tfrac{1}{2} V/I$$

As shown in the drawing, the next six descending order stages of the binary counter 20 are connected through the corresponding resistors 49 through 54, respectively. The values of these resistors increase by a binary progression, the resistor 49 having a resistance 2R, the resistor 50 having a resistance 4R, the resistor 51 having a resistance 8R, and so on. With the resistance values selected in this manner, when the ninth stage of the binary counter is the only stage providing a binary 1, the meter deflection is one-fourth of its full amount. The tenth stage provides a one-half deflection, and comparable deflections can be determined for each of the other stages when they are the only stages energized. Of course, various combinations of binary outputs from the counter 20 supply current in parallel through one or more of the resistors 48 through 54 and result in corresponding deflections of the indictor needle on the meter 45. When all of the stages of the binary counter 20 supply a binary 1 output, maximum current flows through the meter 45, causing it to reach its full deflection.

The three lowest order stages are not shown connected through resistors to the meter 45, since these stages are capable of representing only the binary addresses zero through seven. In view of the large capacity of the memory 13, these addresses do not provide any significant data to the meter. Thus, until address eight is reached, the meter indication is zero. This, however, does not detract from the usefulness of the system. If it were considered desirable to provide a continuous position deflection of the indicator needle on the meter 45 for each and every address location, the three lowest order outputs of the binary counter 20 also could be connected through binary weighted resistors to the lead 47.

Thus, as the binary counter 20 is advanced or reduced in count to change the address location into which information is being written into the RAM memories 16 through 19, or from which information is being read, the meter 45 supplies a reading which corresponds to the relative address location in the memories which is being used. For a system in which data from cards 11 is sequentially stored in the memory bank, the meter gives a continuous indication of the amount of memory capacity which remains as the system continuously stores this data. As a consequence, the system is particularly adapted for supplying data from employee cards used to keep track of the employee arrival and departure in an automatic time clock computing system.

The time clock and employee identification data is stored in the memory 13; and on demand or at regular periodic intervals, the stored information can be removed or read out from the memory. When this is done, the system then may be reset to permit the insertion of more data.

Whenever the meter 45 gives an indication that the memory is full or nearly full of data, the system operators may make provisions to transfer the data to a computer for further processing, or may switch the output of the card reader 10 to another memory bank to preclude the destruction of previously stored data or the loss of data because the capacity of the memories 16 through 19 has been exceeded.

Whenever it is desired to read data out of the memory, a read-write control circuit 50, which may be of conventional type, is switched from its write control output to a read output. As shown in the drawing, an output A from the control circuit 50 is connected to each of the RAM memories 16 through 19. When this output is high, it is indicative of a write control function and permits the storage of new data into the memories under the control of the address outputs from the binary counter 20 and the outputs from the scan counter 29. Whenever the read-write control circuit 50 is switched to its "read" output, the potential on the terminal A goes from a high potential to a low potential. This is used in a conventional manner in the memories 16 through 19 to cause a reading out of the information in those memories under the control of the scan counter 29. At the same time, an inverter 51 causes a high output to appear on a terminal B and this is passed through the OR gate 27 to start the clock 28 in the manner described previously in conjunction with the storage or writing function. The output from terminal B also resets the ten-stage binary counter 20 to its initial or lowest order address, so that the first address location in the memories 16 through 19 is supplied to the BCD coded output terminals 15 under control of the operation of the scan counter 29 for utilization by a local or remote computer which then processes the data.

The read-write control circuit 50 includes a counter for counting the number of clock pulses produced by the clock circuit 28 necessary to step the scan counter 29 through each of the vertical columns of memories 16 through 19. When sufficient pulses have been counted to scan all N columns, a pulse is applied over a terminal C from the control circuit 50 through the OR gate 26 to advance the binary counter 20 to its next binary count. The cycle is then repeated, and the information stored in the next address of the memories 16 to 19 is read.

This operation continues until the number of clock pulses which are counted in the read-write control circuit 50 equals the number required to read all memory positions in all addresses. A control signal then is produced in a conventional manner by the control circuit 50 to terminate the further operation of the reading cycle of the system. The manner in which this is done is not of significance, and is well known to those skilled in the art.

The system which has been described above and which is shown in the drawing provides an easily understandable output indication of the state of memory fullness as information is stored into the memory and as information is read from the memory. The "fullness" of the memory can be readily understood without requiring any knowledge of the manner in which the memory units 16 through 19 operate, or the manner in which the addressing sequence takes place. As a consequence, the system is particularly suitable for use with card readers employed in an automatic computerized time clock system, and enables even the most unsophisticated user to readily understand whether or not the memory has sufficient capacity to accept the data from his card.

I claim:

1. A system for indicating the relative location of addresses in an electronic memory including in combination:
   an electronic memory for storing data in different address locations and having a predetermined plurality of address locations therein;
   means coupled with said memory sequentially for addressing and selecting specific ones of the address locations of said electronic memory; and
   analog display means coupled with at least one of said memory and said addressing means for providing an indication of the relative location in said memory of the address selected by said addressing means.

2. The combination according to claim 1 wherein said analog display means is coupled with the output of said addressing means.

3. The combination according to claim 1 wherein said analog display means comprises an ammeter.

4. The combination according to claim 1 wherein said electronic memory comprises a digital memory, said addressing and selecting means included means for supplying a binary address on a plurality of parallel address lines to corresponding address inputs of said memory; and said combination further includes means coupled with at least some of said address lines for converting said binary address to an analog signal, with said converting means coupled with said analog display means to provide an input signal thereto to control the display therein.

5. The combination according to claim 4 wherein said addressing means comprises a multistage binary counter having said plurality of parallel address lines coupled with the stages thereof; said converting means comprises binary weighted resistors coupled in common at one end with the input to said analog display means and coupled individually at the opposite ends thereof with selected ones of the outputs of said binary counter.

6. The combination according to claim 5 wherein said electronic memory comprises a random access memory.

7. The combination according to claim 1 wherein said memory comprises a random access memory.

8. A system for indicating the degree of fullness of an electronic memory including in combination:
   an electronic memory with a predetermined number of address locations for storing unique digital data at each such address location;
   a plurality of address leads coupled with corresponding address inputs to said electronic memory;
   addressing means coupled with said address leads for supplying binary encoded address signals to said memory to sequentially select individual addresses therein;
   digital-to-analog converter means coupled with said address leads for supplying a signal to an output lead therefrom; and
   an analog meter coupled with said output lead for providing an analog indicia of the address location selected by said addressing means.

9. The combination according to claim 8 wherein said addressing means comprises a multistage binary counter, and means for advancing the count of said computer; wherein said address leads each are coupled with the outputs of different stages of said binary counter.

10. The combination according to claim 9 including card reader means coupled with said memory for supplying input data to the address locations in said memory selected by said binary counter, said card reader including means operated in response to insertion of a card therein for advancing said counter one count to select a new address location in said memory.

11. The combination according to claim 9 wherein said digital-to-analog converter comprises a plurality of binary weighted resistors, each coupled in common between the output lead of said digital-to-analog converter and different ones of said address leads, the resistance values of said weighted resistors being selected to supply a signal on the output lead of said converter which is an analog representation of the binary encoded address signals on said address leads.

12. The combination according to claim 11 wherein said analog display means comprises an ammeter.

* * * * *

UNITED STATES PATENT AND TRADEMARK OFFICE
CERTIFICATE OF CORRECTION

PATENT NO. : 4,046,995
DATED : September 6, 1977
INVENTOR(S) : Ernest J. Salley

It is certified that error appears in the above-identified patent and that said Letters Patent are hereby corrected as shown below:

Column 6, Claim 1, Line 14:

"sequentially for" should be --for sequentially--.

Signed and Sealed this

Eighteenth Day of April 1978

[SEAL]

Attest:

RUTH C. MASON
Attesting Officer

LUTRELLE F. PARKER
Acting Commissioner of Patents and Trademarks